(12) United States Patent
Liu

(10) Patent No.: US 9,073,746 B2
(45) Date of Patent: Jul. 7, 2015

(54) MEMS PRESSURE SENSOR AND MANUFACTURING METHOD THEREFOR

(75) Inventor: Lianjun Liu, Tianjin (CN)

(73) Assignee: MEMSEN ELECTRONICS INC (CN)

( * ) Notice: Subject to any disclaimer, the term of this patent is extended or adjusted under 35 U.S.C. 154(b) by 0 days.

(21) Appl. No.: 14/005,185

(22) PCT Filed: Feb. 23, 2012

(86) PCT No.: PCT/CN2012/071488
§ 371 (c)(1),
(2), (4) Date: Sep. 13, 2013

(87) PCT Pub. No.: WO2012/122875
PCT Pub. Date: Sep. 20, 2012

(65) Prior Publication Data
US 2014/0001584 A1    Jan. 2, 2014

(30) Foreign Application Priority Data
Mar. 15, 2011   (CN) .......................... 2011 1 0061456

(51) Int. Cl.
*B81B 3/00* (2006.01)
*B81B 1/00* (2006.01)
(Continued)

(52) U.S. Cl.
CPC ....... *B81B 3/0021* (2013.01); *B81B 2201/0264* (2013.01); *B81B 2207/012* (2013.01); *B81C 1/00158* (2013.01); *B81C 2203/0154* (2013.01);
(Continued)

(58) Field of Classification Search
CPC ................................. H01L 21/50; H01L 21/78
USPC ........ 257/48, 416, 419, E21.599; 438/53, 51, 438/107, 113; 73/718
See application file for complete search history.

(56) References Cited

U.S. PATENT DOCUMENTS 5,095,349 A    3/1992   Fujii et al.
5,731,520 A *  3/1998   Stevenson et al. .......... 73/514.32
(Continued)

FOREIGN PATENT DOCUMENTS

CN    1865882 A    11/2006
CN    101082525 A   12/2007
(Continued)

OTHER PUBLICATIONS

International Search Report for International Application No. PCT/CN2012/071488; Date of Mailing: May 31, 2012, with English Translation.

*Primary Examiner* — Fernando L Toledo
*Assistant Examiner* — Adam S Bowen
(74) *Attorney, Agent, or Firm* — Cantor Colburn LLP

(57) ABSTRACT

A Micro Electromechanical System (MEMS) pressure sensor may include a first substrate provided with a sensitive diaphragm of a piezoresistive pressure sensing unit, an electrical connecting diffusion layer and a first bonding layer on a surface of the first substrate; and a second substrate provided with an inter-conductor dielectric layer, a conductor connecting layer in the inter-conductor dielectric layer and/or a second bonding layer on a surface of the second substrate. The second substrate may be arranged opposite to the first substrate, and the second substrate may be fixedly coupled to the first substrate via the first bonding layer and the second bonding layer; the pattern of the first bonding layer is corresponding to the pattern of the second bonding layer, and both the first bonding layer and the second bonding layer may be formed of a conductive material.

19 Claims, 5 Drawing Sheets

(51) Int. Cl.
  *G01L 9/00* (2006.01)
  *B81C 1/00* (2006.01)

(52) U.S. Cl.
  CPC ....... *B81C 2203/0792* (2013.01); *G01L 9/0042* (2013.01); *G01L 9/0054* (2013.01); *B81C 1/00238* (2013.01)

(56) References Cited

U.S. PATENT DOCUMENTS

| | | | |
|---|---|---|---|
| 7,923,904 B2* | 4/2011 | Takeuchi et al. | 310/340 |
| 7,998,777 B1* | 8/2011 | Gamage et al. | 438/53 |
| 2008/0053236 A1* | 3/2008 | Gogoi et al. | 73/718 |
| 2008/0217708 A1* | 9/2008 | Reisner et al. | 257/416 |
| 2013/0001550 A1* | 1/2013 | Seeger et al. | 257/48 |
| 2013/0001710 A1* | 1/2013 | Daneman et al. | 257/415 |

FOREIGN PATENT DOCUMENTS

| | | |
|---|---|---|
| CN | 101171665 A | 4/2008 |
| CN | 101738280 A | 6/2010 |
| CN | 201716136 U | 1/2011 |
| CN | 102156012 A | 8/2011 |
| EP | 0822398 A1 | 2/1998 |

* cited by examiner

US 9,073,746 B2

MEMS PRESSURE SENSOR AND MANUFACTURING METHOD THEREFOR

This application is the US national phase of International Application No. PCT/CN2012/071488 filed on Feb. 23, 2012, which claims the priority to the Chinese patent application No. 201110061456.5, entitled "MEMS PRESSURE SENSOR AND MANUFACTURING METHOD THEREOF", filed with the State Intellectual Property Office of PRC on Mar. 15, 2011, which is incorporated herein by reference in its entirety.

FIELD OF THE INVENTION

The present invention relates to the technical field of Micro Electromechanical System (MEMS), and particularly to a MEMS pressure sensor and a manufacturing method thereof.

BACKGROUND OF THE INVENTION

MEMS is a micro electromechanical system which integrates a micro sensor, an executer and a signal processing and controlling circuit, an interface circuit, communication and a power supply as a whole. In recent years, the traditional mechanical sensor is progressively replaced by the MEMS pressure sensor in the fields of automotive electronics, consumer electronics and industry electronics, and the MEMS pressure sensor has broad market prospects. For example, the MEMS technology is widely used in a tire pressure monitoring pressure sensor, an engine oil pressure sensor, an automotive braking system air pressure sensor, an automotive engine intake manifold pressure sensor and the like.

As compared to the traditional mechanical sensor, the MEMS pressure sensor has a smaller size, a higher control precision and a manufacturing process compatible with the silicon IC technology; and therefore, the performance/cost ratio of the MEMS pressure sensor is greatly improved. At present, the MEMS pressure sensor includes piezoresistive type pressure sensor and capacitive type pressure sensor, either of which is a MEMS sensor manufactured on a silicon chip. The piezoresistive pressure sensor applies the principle of a resistance of a silicon resistor changing under a stress (a pressure) and adopts a Wheatstone bridge consisting of a high-precision silicon resistance strain gauge as a force-electricity conversion measuring circuit, high measuring precision and a lower power consumption may be obtained.

The traditional manufacturing method for the piezoresistive pressure sensor includes: firstly, forming multiple resistors or a Wheatstone bridge on a silicon substrate by using an ion implantation or a diffusion process; then forming a sensitive diaphragm by etching an area of the silicon substrate where the resistors are located through a wet-etching or dry-etching process; and finally forming a pressure reference cavity at the backside of the sensitive diaphragm through a sealing process, and performing a packaging process to form a chip of a sensor. The sensitive diaphragm generates a deformation or a stress under an external pressure, and a change in the resistance of the resistor or the Wheatstone bridge is generated correspondingly. Under a voltage basis, the change in the resistance described above is converted to a voltage signal which is taken as an output signal after being amplified by a signal processing circuit. The main processes of this manufacturing method are similar to that of a CMOS integrated circuit.

Recently, Bosch has invented a manufacturing method for a piezoresistive pressure sensor. The method adopts a special process to form a buried cavity in a certain area of a silicon substrate, and thus does not use the traditional deep silicon etching process to form a sensitive diaphragm. STMicroelectronics manufactures a cavity in a monocrystalline silicon substrate by processes of etching, epitaxy and annealing to form a monocrystalline silicon surface film and the piezoresistive pressure sensor.

After a traditional MEMS pressure sensor has been manufactured, a packaging process with a signal processing chip will be performed: a pressure sensor chip and a signal processing circuit chip are disposed on a packaging cavity substrate and are coupled to each other through wire-bonding; then the chips are coated with a protective soft gel and finally sealed with a plastic cover or a metal cover. Furthermore, the pressure sensor chip and the signal processing circuit chip may firstly disposed on the planar packaging substrate and the chips are coupled through wire-bonding; and then the chips are coated by a protective soft gel and covered by a metal housing.

However, the problem is that, in the above manufacturing and packaging method for the traditional MEMS pressure sensor, the pressure sensor chip and the signal processing circuit chip are discrete chips and integrated together by a packaging process. The process for the cavity packaging with the plastic cover or a metal cover is complicated and thus not easily compatible with the mature integrated circuit (IC) manufacturing technology, leading to a higher cost and a larger size.

SUMMARY OF THE INVENTION

An object of the present invention is to provide a MEMS pressure sensor and a manufacturing method thereof, which can be compatible with the IC manufacturing process, effectively decrease the manufacturing cost and reduce the size of the sensor.

To solve the above problem, a MEMS pressure sensor is provided according to the present invention, and the MEMS pressure sensor includes:

a first substrate provided with a sensitive diaphragm of a piezoresistive pressure sensing unit, an electrical connecting diffusion layer and a first bonding layer on a surface of the first substrate; and a second substrate provided with an inter-conductor dielectric layer, a conductor connecting layer in the inter-conductor dielectric layer and/or a second bonding layer on a surface of the second substrate;

wherein the second substrate is arranged opposite to the first substrate, and the second substrate is fixedly coupled to the first substrate via the first bonding layer and the second bonding layer; the pattern of the first bonding layer is corresponding to the pattern of the second bonding layer, and both the first bonding layer and the second bonding layer are formed of a conductive material.

The second bonding layer may be above the conductor connecting layer, or the second bonding layer may be the uppermost conductor layer among the conductor connecting layers.

The first bonding layer and/or the second bonding layer may be a Ge layer, a Si layer, an Au layer, an Au/Sn laminated layer or an Al/Ge laminated layer.

The first substrate may include a Silicon-On-Insulator (SOI) substrate which sequentially includes a silicon bulk layer, and a buried oxide layer and a SOI layer, and the piezoresistive pressure sensing unit and the electrical connecting diffusion layer may be formed in the SOI layer.

The sensitive diaphragm may include a Wheatstone bridge consisting of a plurality of resistors, and the back surface of the first substrate may be provided with an opening through which the sensitive diaphragm is exposed to the atmosphere.

The second substrate may include a SOI substrate or a monocrystalline silicon substrate, and a signal processing circuit may be further provided in the substrate below the inter-conductor dielectric layer.

The pressure sensor may further include a reference pressure cavity disposed between the sensitive diaphragm and the second substrate.

The sensitive diaphragm may be provided with a protective dielectric layer.

A part of the surface of the second substrate within the reference pressure cavity may be provided with a self-test electrode having a position corresponding to that of the sensitive diaphragm.

The second substrate may be further provided with a plurality of wire-bonding pads on the periphery of the conductor connecting layer, and the part of the first substrate corresponding to the plurality of wire-bonding pads may be removed.

The MEMS pressure sensor may further include:
a packaging substrate which is below the second substrate and provided with a plurality of wire-bonding pins;
a packaging body which is above the packaging substrate and encloses the first substrate and the second substrate;
an adhesive which is disposed between the second substrate and the packaging substrate; and
a lead which is in the packaging body, two ends of the lead are respectively coupled to the wire-bonding pad and the wire-bonding pin.

A stress buffer layer may be further provided between the packaging body and the first substrate and the second substrate which are fixedly coupled to each other.

Accordingly, a manufacturing method for a MEMS pressure sensor is provided according to the present invention, and the method includes:
providing a first substrate, and forming, in the first substrate, a piezoresistive pressure sensing unit, an electrical connecting diffusion layer and a first bonding layer on a surface of the first substrate;
providing a second substrate, and forming, in the second substrate, an inter-conductor dielectric layer, a conductor connecting layer in the inter-conductor dielectric layer and/or a second bonding layer on a surface of the second substrate; and
arranging the first bonding layer to be opposite to the second bonding layer, and bonding the first bonding layer to the second bonding layer according to a pattern correspondence so as to fixedly and electrically couple the first substrate to the second substrate.

The first substrate may include a SOI substrate which includes a silicon bulk layer, a buried oxide layer and a SOI layer, and the step of forming, in the first substrate, a piezoresistive pressure sensing unit, an electrical connecting diffusion layer and a first bonding layer on a surface of the first substrate may include:
manufacturing the piezoresistive pressure sensing unit and the electrical connecting diffusion layer in the SOI layer, the piezoresistive pressure sensing unit includes a sensitive diaphragm and manufacturing a Wheatstone bridge consisting of a plurality of resistors in the sensitive diaphragm;
depositing a first bonding material layer on the surface of the first substrate on which the piezoresistive pressure sensing unit and the electrical connecting diffusion layer are provided; and
etching the first bonding material layer by a photolithography process using a first mask plate to form the first bonding layer, the part of the first bonding material layer above the sensitive diaphragm being also removed.

The step of forming, in the second substrate, an inter-conductor dielectric layer, a conductor connecting layer in the inter-conductor dielectric layer and/or a second bonding layer on a surface of the second substrate may include:
forming, in the second substrate, the inter-conductor dielectric layer and the conductor connecting layer in the inter-conductor dielectric layer;
depositing a second bonding material layer on the conductor connecting layer, or using the uppermost conductive material layer in the conductor connecting layer as the second bonding material layer; and
etching the second bonding material layer by a photolithography process using a second mask plate to form the second bonding layer.

The manufacturing method for the MEMS pressure sensor may further include: forming a plurality of wire-bonding pads in a wire-bonding pad area on the periphery of the conductor connecting layer while forming the second bonding layer on the second substrate.

The manufacturing method for the MEMS pressure sensor may further include: removing the part of the first substrate corresponding to the wire-bonding pad area before or after fixedly and electrically coupling the first substrate to the second substrate so as to expose the plurality of wire-bonding pads in the wire-bonding pad, and meanwhile, removing the silicon bulk layer and the buried oxide layer corresponding to the sensitive diaphragm and opposite to the second substrate, keeping only the sensitive diaphragm.

The manufacturing method for the MEMS pressure sensor may further include: removing the part of the first substrate corresponding to the wire-bonding pad area so as to expose the plurality of wire-bonding pads in the wire-bonding pad area before or after fixedly and electrically coupling the first substrate to the second substrate, and meanwhile, removing the silicon bulk layer corresponding to the sensitive diaphragm and opposite to the second substrate, keeping the buried oxide layer and the sensitive diaphragm.

The arranging the first bonding layer to be opposite to the second bonding layer and bonding the first bonding layer to the second bonding layer according to a pattern correspondence may include the following steps:
arranging the first bonding layer of the first substrate to be opposite to the second bonding layer of the second substrate, so that the pattern of the first bonding layer is in contact with the pattern of the second bonding layer; and
applying a pressure from the back surfaces of the two substrates, and meanwhile, heating the two substrates, so that the contact surfaces of the first bonding layer and the second bonding layer are coupled together.

The manufacturing method for the MEMS pressure sensor may further include:
forming a self-test electrode while forming the second bonding layer in the second substrate, or forming the self-test electrode while forming the conductor connecting layer in the second substrate, the position of the self-test electrode being corresponding to that of the sensitive diaphragm of the piezoresistive pressure sensing unit in the first substrate.

The manufacturing method for the MEMS pressure sensor after fixedly and electrically coupling the first substrate to the second substrate may further include:
providing a packaging substrate on which a plurality of wire-bonding pins are provided;
coupling the surface of the second substrate opposite to the first substrate to the packaging substrate;

electrically coupling the wire-bonding pads of the second substrate to the corresponding wire-bonding pins packaging substrate via a lead; and performing a plastic molding process to fill a space of the surface of the packaging substrate except for the first substrate and the second substrate with a packaging body.

The manufacturing method for the MEMS pressure sensor before performing the plastic molding may further include:

forming a stress buffer layer between the packaging body and the first substrate and the second substrate which are fixedly coupled to each other.

As compared to the existing technology, the above technical solution has the following advantages.

The MEMS pressure sensor and the manufacturing method thereof according to the embodiment of the present invention include two substrates, the first substrate is configured to form the piezoresistive pressure sensing unit, and the second substrate is configured to form the conductor connecting layer (and the signal processing circuit). The two substrates are face to face coupled together through the first bonding layer and the second bonding layer, and a sealed structure is formed between the two substrates. Then the back surface of the first substrate is etched by the silicon deep reactive etching, and the sensitive diaphragm element of the piezoresistive pressure sensing unit and the wire-bonding pad area on the second substrate are exposed at the same time. The packaging is performed finally. Therefore, the first substrate and the second substrate may be manufactured separately, and either of the manufacturing processes for the two substrates is compatible with the IC. The two substrates are integrated together through the bonding process, which avoids the complexity of the packaging process integration, decreases the size of a device and reduces the cost, and has the advantage that the process is simple and convenient.

Furthermore, the above method may be achieved by various kinds of plastic packaging such as QFN, DFN or SOIC. As compared to the manufacturing process for the traditional pressure sensor, the above method may effectively reduce the cost and decrease the size of the sensor.

BRIEF DESCRIPTION OF THE DRAWINGS

The above mentioned and other objects, features and advantages will be more apparent from the accompanying drawings in which the like reference numerals designate the same elements. The accompanying drawings are not intentionally drawn on a one to one scale according to the actual size and are intended to show the subject matter of the present invention.

DETAILED DESCRIPTION OF THE INVENTION

To make the above objects, features and advantages of the present invention to be more apparent and understood, the embodiments of the present invention will be described in detail in conjunction with the accompanying drawings below.

Many details are described below to make the present invention fully understand, and the present invention may be further implemented in other ways different from the ways described herein. The similar extension may be made by the skilled in the art without departing from the spirit of the present invention. Therefore, the present invention is not limited to the embodiments disclosed below.

Furthermore, the present invention will be described in detail in conjunction with schematic diagrams. When an embodiment of the present invention is described, a sectional view of a structure of a device will not be locally enlarged on a general scale for the purpose of demonstration. The shown schematic diagrams are exemplary and will not limit the protection scope of the present invention. Additionally, a three dimension space such as a length, a width and a depth should be included in the actual manufacturing.

First Embodiment

Figure 1:
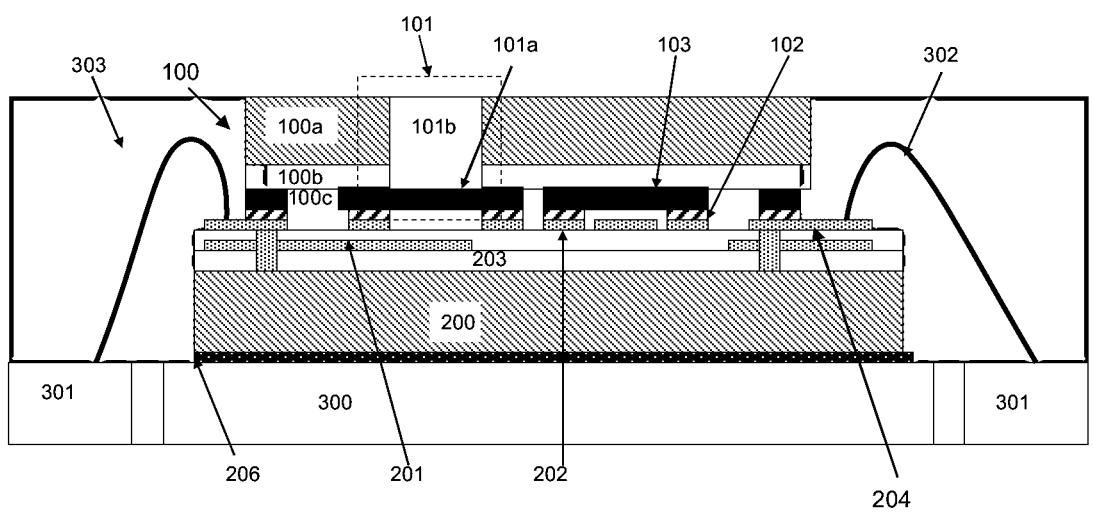
FIG. 1 is a schematic structural diagram of a MEMS pressure sensor according to a first embodiment.

FIG. 1 is a schematic structural diagram of a MEMS pressure sensor according to the embodiment. As shown, the MEMS pressure sensor includes: a first substrate 100 provided with a piezoresistive pressure sensing unit 101, an electrical connecting diffusion layer 103 and a first bonding layer 102 on a surface of the first substrate 100; and a second substrate 200 provided with an inter-conductor dielectric layer, a conductor connecting layer 201 in the inter-conductor dielectric layer and a second bonding layer 202 on a surface of the second substrate 200.

The second substrate 200 is arranged opposite to the first substrate 100, the two substrates are fixedly coupled to each other through the first bonding layer 102 and the second bonding layer 202 either of which is formed of a conductive material, and there exists a pattern correspondence between the first bonding layer 102 and the second bonding layer 202. The "pattern correspondence" here means the alignment of the patterns of corresponding positions of the first bonding layer 102 and the second bonding layer 202. The sizes, shapes of the patterns may be different between the two substrates and the positions of the patterns may be misaligned, as long as the overlapping parts between the patterns can be in contact with each other after the second substrate 200 is arranged opposite to the first substrate 100. It is to be noted that the "above" and "below" for indicating position relationship hereinafter are limited to the case that the first substrate 100 is reversely disposed above the second substrate 200.

In this embodiment, the first substrate 100 includes a SOI substrate which includes a silicon bulk layer 100a, a buried oxide layer (BOX) 100b and a SOI layer 100c. The SOI layer 100c is provided with the piezoresistive pressure sensing unit 101 and the electrical connecting diffusion layer 103. The piezoresistive pressure sensing unit 101 includes a sensitive diaphragm 101a which is provided with a Wheatstone bridge (not shown) consisting of multiple resistors. Either of the sensitive diaphragm 101a and the electrical connecting diffusion layer 103 is formed through the photolithography, etching and diffusion processes performed on the SOI layer. In addition, a surface of the piezoresistive pressure sensing unit 101 and the electrical connecting diffusion layer 103 may further be provided with a protective dielectric layer (not shown) which is configured to protect the sensitive diaphragm from being damaged during the successive process of forming the first bonding layer later, and may serve as an etching stop layer for the successive process.

The parts of the silicon bulk layer 100a and the buried oxide layer 100b above the sensitive diaphragm 101a (on the surface of the sensitive diaphragm 101a opposite to the second substrate 200) are removed to form an opening 101b through which the sensitive diaphragm 101a is exposed to the atmosphere. A reference pressure cavity 101c is formed under the sensitive diaphragm 101a (on the surface of the sensitive diaphragm 101a towards the second substrate 200), and is located between the second substrate 200 and the sensitive diaphragm 101a. The sensitive diaphragm 101a has a degree of freedom to deform in the direction perpendicular to the first substrate 100 and the second substrate 200 due to the existence of the opening 101b and the reference pressure cavity 101c.

Furthermore, a protective dielectric layer (not shown) may be further provided on the sensitive diaphragm 101a, which is configured to protect the sensitive diaphragm from being damaged in manufacturing processes and in use.

The second substrate 200 includes a SOI substrate or a monocrystalline silicon substrate, the second substrate 200 is provided with an inter-conductor dielectric layer 203 and a conductor connecting layer 201 in the inter-conductor dielectric layer 203, and a second bonding layer 202 is further provided above the inter-conductor dielectric layer 203.

The first bonding layer 102 is formed on a surface of the first substrate, and the pattern of the first bonding layer 102 is not provided on the sensitive diaphragm 101a in the SOI layer in order to avoid affecting the sensitivity of the sensitive diaphragm 101a. The second boding layer 202 is formed above the conductor connecting layer 201. In other embodiments of the present invention, the second bonding layer 202 is the uppermost conductor layer in the conductor connecting layer. In other words, the pattern of the second bonding layer 202 is manufactured during the process of manufacturing the uppermost conductor layer in the conductor connecting layer, thus a photolithography process can be omitted and the cost can be reduced.

Preferably, a signal processing circuit such as a CMOS circuit (not shown) is further provided in the second substrate 200, and the inter-conductor dielectric layer and the conductor connecting layer are disposed above the signal processing circuit. The signal processing circuit is configured to receive, convert and detect an external pressure signal sensed by the piezoresistive pressure sensing unit 101. The conductor connecting layer 201 is configured to connect different devices and connect the second bonding layer 202 to the signal processing circuit in the second substrate 200.

The pattern of the first bonding layer 102 is corresponding to the pattern of the second bonding layer 202, and the first bonding layer 102 is fixedly coupled to the second bonding layer 202. Both the first bonding layer 102 and the second bonding layer 202 are formed of a conductive material and thus the electrical connection between the first substrate 100 and the second substrate 200 may be achieved such that the piezoresistive pressure sensing unit 101 in the first substrate 100 is coupled with the conductor connecting layer 201 in the second substrate 200.

The first bonding layer and/or the second bonding layer is a Ge layer, a Si layer, an Au layer, an Al layer, an Au/Sn laminated layer or an Al/Ge laminated layer. The first bonding layer and/or the second bonding layer may be formed of other conductors or alloy materials.

The reference pressure cavity 101c is formed by arranging the sensitive diaphragm 101a, the first bonding layer 102 of the first substrate, the inter-conductor dielectric layer 203 and the second bonding layer 202 of the second substrate in a circle; and the position of the reference pressure cavity 101c is corresponding to that of the opening 101b. The reference pressure cavity 101c is disposed between the sensitive diaphragm 101 and the second substrate 200, and the sensitive diaphragm 101a is exposed to the atmosphere through the opening 101b on the back surface of the first substrate 100.

The reference pressure cavity 101c and the opening 101b are respectively provided on the two sides of the sensitive diaphragm 101a. The reference pressure cavity 101c is hermetic so as to provide a fixed reference pressure value with respect to a change in the pressure of the open port on the other side.

Furthermore, multiple wire-bonding pads 204 are provided on the second substrate 200, and the wire-bonding pads 204 are disposed on the second substrate 200 and in the same film layer as the second boding layer 202. The part of the first substrate 100 corresponding to the wire-bonding pads 204 is removed, so that the wire-bonding pads 204 is exposed and coupled with a lead 302.

The first substrate 100 includes an array consisting of a plurality of the MEMS pressure sensor chips, and a conductor connecting array (not shown) corresponding to a plurality of the MEMS pressure sensor chips is provided in the second substrate 200. The two substrates are cut and packaged after being integrated, which is compatible with the chip manufacturing process for the IC, suitable for mass manufacturing, and conducive to improve the productivity.

After the packaging process is performed, the MEMS pressure sensor according to this embodiment further includes a packaging substrate 300 below the second substrate 200, and a packaging body 303 above the packaging body 300 which encloses the first substrate 100 and the second substrate 200. An adhesive 206 is further provided between the second substrate 200 and the packaging substrate 300. Preferably, a stress buffer layer may be provided between the packaging body 303 and the first substrate 100 and the second substrate 200 which are fixedly coupled to each other, which is configured to buffer the stress of the packaging body 303 so as to prevent sensitivity of the sensitive diaphragm from being interfered.

It is to be noted that the "encloses" in the step of the packaging body encloses the first substrate and the second substrate according to the present invention means enclosing the first substrate and the second substrate together. As shown in FIG. 1, the packaging body may enclose the first substrate and the second substrate from the side surfaces of the first substrate and the second substrate, and may further cover the back surface of the first substrate except for the opening on the back surface of the first substrate.

Figure 2:
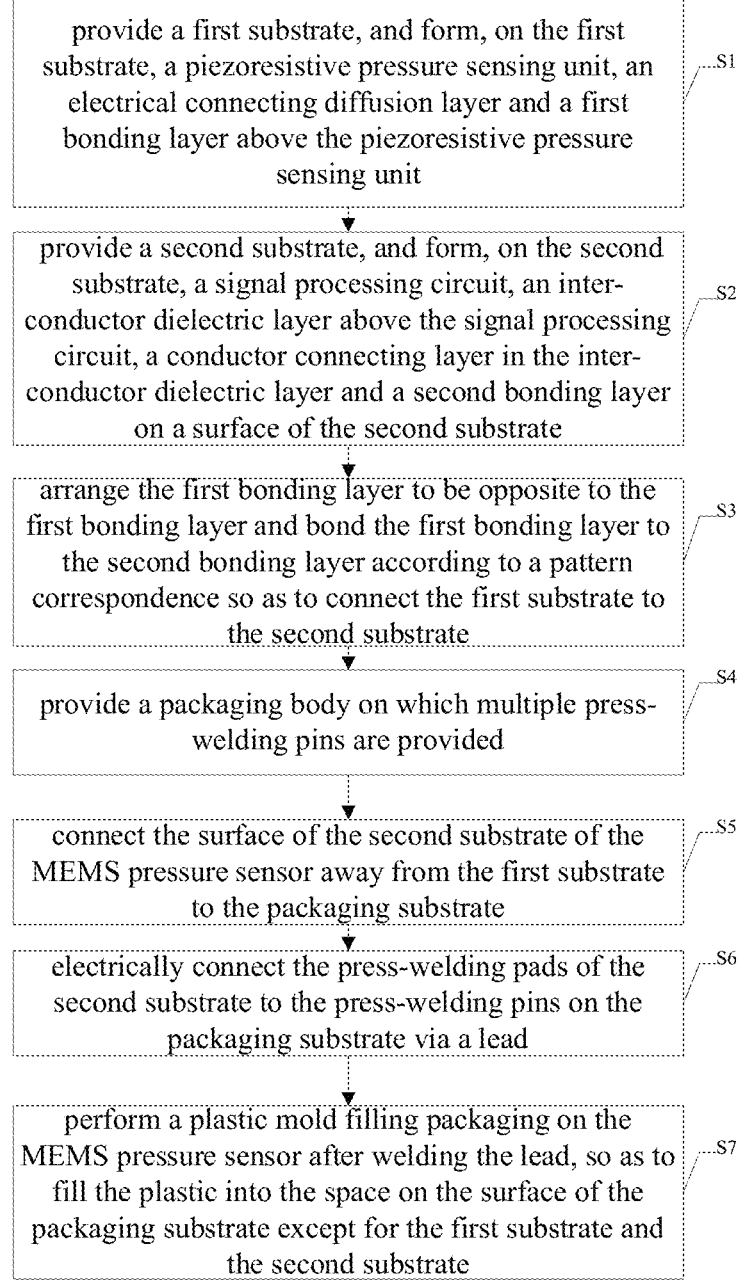
FIG. 2 is a flowchart for the manufacturing method of the MEMS pressure sensor according to the first embodiment.

The manufacturing method for the MEMS pressure sensor will be described in detail in conjunction with the accompanying drawings below. FIG. 2 is a flowchart for the manufacturing method of the MEMS pressure sensor according to an embodiment of the present invention. FIGS. 3 to 6 are schematic diagrams for the manufacturing method of the MEMS pressure sensor. As shown, the manufacturing method includes the following steps.

Figure 3:
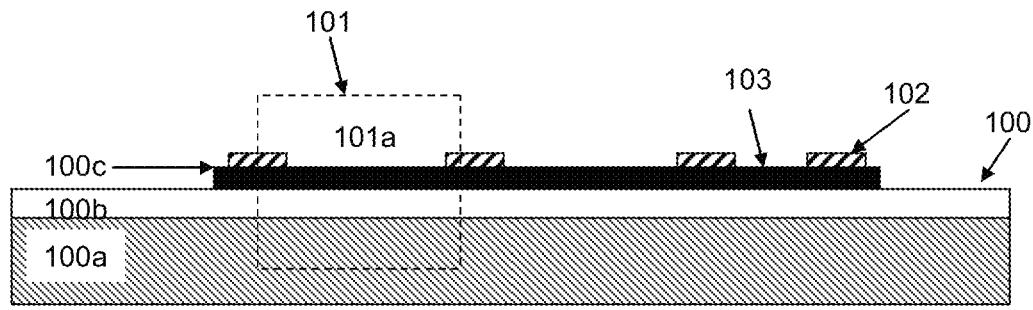
FIGS. 3 to 7 are schematics diagrams for the manufacturing method of the MEMS pressure sensor according to the first embodiment.

Step S1: a first substrate 100 is provided. The first substrate 100 is provided with a piezoresistive pressure sensing unit 101, an electrical connecting diffusion layer 103 and a first bonding layer 102 on a surface of the first substrate 100, as shown in FIG. 3.

The first substrate 100 includes a SOI substrate which includes a silicon bulk layer 100a, a buried oxide layer (BOX) 100b and a SOI layer 100c. A piezoresistive pressure sensing unit 101 and the electrical connecting diffusion layer 103 are manufactured in the SOI layer by using photolithography, etching and diffusion processes. The piezoresistive pressure sensing unit 101 includes a sensitive diaphragm 101a in which a Wheatstone bridge (not shown) consisting of multiple resistors is manufactured. Furthermore, a protective dielectric layer (not shown) may be preferably provided on the piezoresistive pressure sensing unit 101 and the electrical connecting diffusion layer 103.

Next, a first bonding material layer (not shown) is deposited on the surface of the first substrate in which the piezoresistive sensing unit 101 and the electrical connecting diffusion layer 103 are provided. The first bonding material layer is formed on the SOI layer 100c but not on the sensitive diaphragm in the SOI layer so as to prevent the sensitivity of the sensitive diaphragm 101a from being affected. Then the first bonding material layer is etched by the photolithography process using a first mask plate to form the first bonding layer 102. The etching process adopted in this step may be the traditional wet-etching process or plasma etching process. Thus, the manufacturing process of the first substrate 100 has been accomplished.

Figure 4:
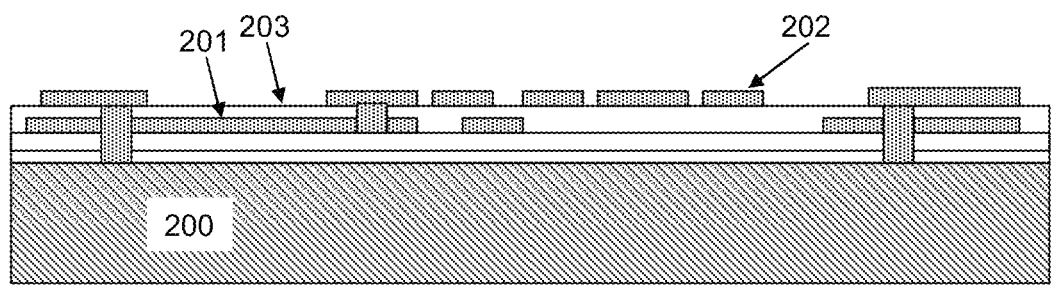

Step S2: a second substrate 200 is provided. The second substrate 200 is provided with an inter-conductor layer 203, a conductor connecting layer 201 in the inter-conductor dielectric layer 203, and the second bonding layer 202 above the inter-conductor dielectric layer 203, as shown in FIG. 4.

The second substrate 200 includes a SOI substrate or a monocrystalline silicon substrate. Preferably, a signal processing circuit such as a CMOS circuit is firstly formed in the second substrate 200 according to the traditional process. Then the inter-conductor dielectric layer 203 in the signal processing circuit, and the conductor connecting layer 201 in the inter-conductor dielectric layer 203 are formed in the signal processing circuit. This step may be implemented by using the copper interconnection process or the aluminum interconnection process.

Next, a second bonding material layer (not shown) is deposited on the inter-conductor dielectric layer 203. Then the second bonding material layer is etched by the photolithography using a second mask plate to form the second bonding layer 202. The second bonding layer 202 may be electrically coupled to the conductor connecting layer 201 below the second boding layer 202 through a through-hole and a connecting plug in the inter-conductor dielectric layer.

Both the first bonding layer 102 and the second bonding layer 202 are formed of a conductive material, for example, the first bonding layer 102 and/or the second bonding layer 202 is an Au layer, an Al layer, an Au/Sn laminated layer or an Al/Ge laminated layer. In the case where the first bonding layer 102 and/or the second bonding layer 202 is an Au/Sn laminated layer, a pattern of the first bonding layer 102 and/or the second bonding layer 202 is formed by an electroplating process, and in the case where the first bonding layer 102 and/or the second bonding layer 202 is an Al/Ge laminated layer, the pattern of the first bonding layer 102 and/or the second bonding layer 202 is formed by a photolithography and etching process. Both the first bonding layer 102 and the second bonding layer 202 are formed of a conductive material. For example, the first bonding layer 102 and/or the second bonding layer 202 is an Au layer, an Al layer, an Au/Sn laminated layer or an Al/Ge laminated layer. In the case where the first bonding layer 102 and/or the second bonding layer 202 is the Au/Sn laminated layer, an Au layer and a Sn layer are sequentially deposited. Then the photolithography and etching process is performed on the laminated layer. Similarly, the manufacturing method is same as the above in the case where the first bonding layer and/or the second bonding layer is formed by the Al/Ge laminated layer.

Preferably, the bonding layer 202 is formed of the same material (e.g., Al) as the conductor connecting layer 201, and the second bonding layer 202 is the uppermost conductor layer in the conductor connecting layer. In other words, the pattern of the second bonding layer 202 is formed during the process of manufacturing the uppermost conductor layer in the conductor connecting layer, thus, a photolithography process can be omitted and the cost can be reduced.

After the photolithography and etching process, there exists a correspondence between the patterns of the first bonding layer 102 and the second bonding layer 202. The "correspondence" here means: when the first substrate 100 and the second substrate 200 are arranged opposite to each other, the first bonding layer 102 is provided toward the second bonding layer 202, and the positions and shapes of the patterns of the first bonding layer 102 and the second bonding layer 202 can correspond to each other and be correspondingly coupled.

When the second bonding layer 202 is formed, multiple wire-bonding pads 204 of a wire-bonding pad area are formed on the conductor connecting layer 201 and a part of the second substrate 200. The multiple wire-bonding pads 204 are formed in the same process as the second boding layer 202.

The signal processing circuit and the conductor connecting layer 201 are located in a device area of the second substrate 200, and an area of the second substrate 200 outside the device area is the wire-bonding pad area in which multiple wire-bonding pads 204 are provided for coupling with wire-bonding. Furthermore, an area of the second substrate 200 outside the device area further includes a chip dicing area.

Figure 5:
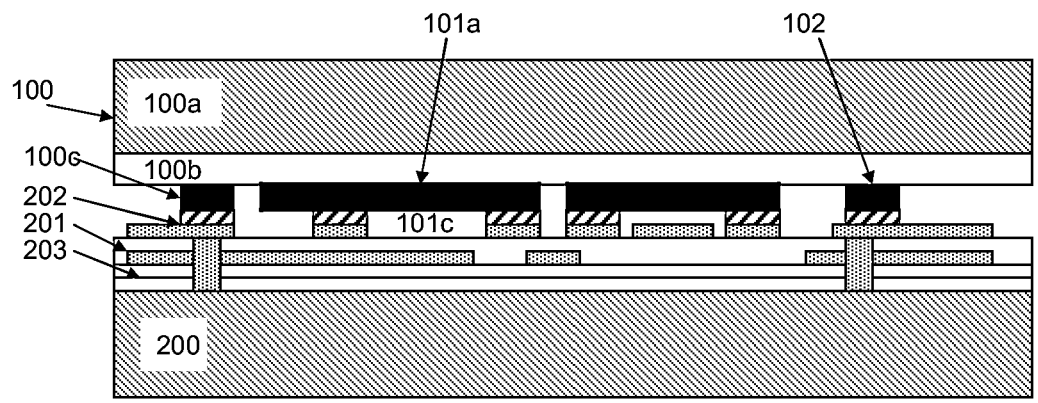

Step S3: arranging the first bonding layer 102 to be opposite to the second bonding layer 202, and bonding the first bonding layer 102 to the second bonding layer according to a pattern correspondence to connect the first substrate 100 to the second substrate 200, as shown in FIG. 5.

Firstly, the first bonding layer 102 of the first substrate 100 is arranged opposite to the second bonding layer 202 of the second substrate 200 such that the pattern of the first bonding layer 102 can be in contact with the pattern of the second bonding layer 202. Then, a pressure is applied from the back surfaces of the two substrates, and meanwhile, the two substrates are heated, so that the contact surfaces of the first bonding layer 102 and the second bonding layer 202 are coupled together. For example, both the first bonding layer 102 and the second bonding layer 202 are an Al layer, a pressure of 40 kN to 90 kN is applied to the substrates through a suction cup on the back surfaces of the substrates, and the substrates are heated up to 400° C. A solid state diffusion occurs in the Al layers in contact with each other and the two substrates are fixedly coupled to each other after the temperature is lowered. A process parameter of the above coupling process varies based on different materials of the first bonding layer 102 and the second bonding layer 202.

Both the first bonding layer 102 and the second bonding layer 202 are formed of a conductive material such as a conductor or an alloy. When the first bonding layer 102 is fixedly coupled to the second bonding layer 202, the piezoresistive sensing unit 101 and the electrical connecting diffusion layer 103 of the first substrate 100 can be electrically coupled to the conductor connecting layer 203 (and the signal processing circuit) of the second substrate 200 such that the piezoresistive pressure sensing unit 101 is integrated with the conductor connecting layer 203 (and the signal processing circuit).

Figure 6:
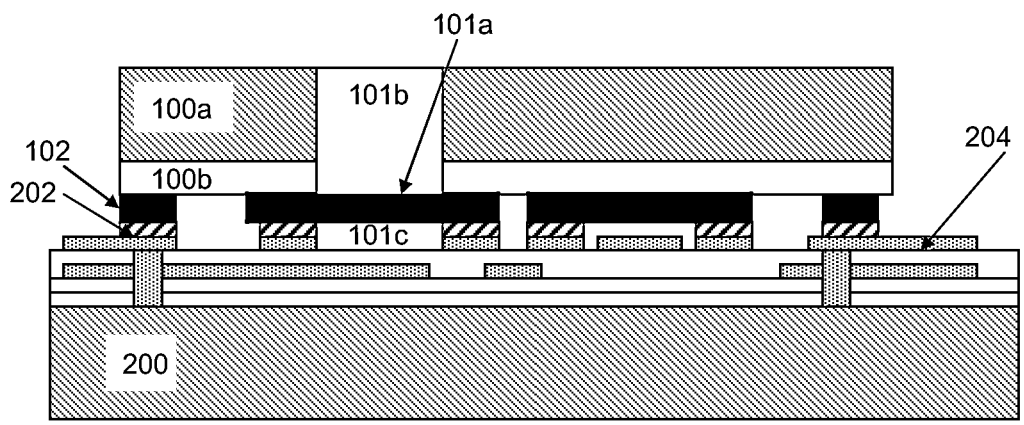

Preferably, as shown in FIG. 6, after coupling the first substrate 100 to the second substrate 200, the manufacturing method further includes: removing a part of the first substrate 100 corresponding to the wire-bonding pad area by the etching process so as to expose the multiple wire-bonding pads 204 in the wire-bonding pad area, and meanwhile, removing the silicon bulk layer 100a and the buried oxide layer 100b on the back surface of the sensitive diaphragm, the etching is stopped at the back surface of the sensitive diaphragm 101a.

For example, a masking layer (not shown) is firstly formed on the back surface of the first substrate 100, for exposing the opening and the parts of the back surface of the first substrate 100 corresponding to the wire-bonding pad area. The silicon bulk layer 100a and the buried oxide layer 100b are etched from the back surface of the first substrate 100 by a first etching gas. When most of the buried oxide layer material is removed, the etching at the opening is close to the back surface of the sensitive diaphragm, and only the part of buried oxide layer which is relatively thin is remained on the part of the first substrate 100 corresponding to the wire-bonding pad area. The etching is continued by using a second etching gas (which has a high etching selectivity for silicon) until the entire buried oxide layer is all removed to form the diaphragm opening port, and the part of the first substrate corresponding to the wire-bonding pad area is all removed at the mean time.

Furthermore, the above step may be separately performed on the first substrate 100 before the first bonding layer 102 of the first substrate 100 is in coupled with the second bonding layer 202 of the second substrate 200, so as to prevent the second substrate 200 from being polluted in the etching process.

To remove the part of the substrate 100 corresponding to the sensitive diaphragm 101a of the piezoresistive pressure sensing unit 101 may be to sequentially remove the silicon bulk layer 100a and the buried oxide layer 100b, only the sensitive diaphragm 101a being kept; and may be to stop the etching on the surface of the buried oxide layer 100b, only the silicon bulk layer 100a being removed, so the buried oxide layer 100b may function to protect the sensitive diaphragm. In this solution, the part of the buried oxide layer on the first substrate corresponding to the wire-bonding pad area needs to be removed in advance in the step S1.

After the sensitive diaphragm 101a, the first bonding layer 102 of the first substrate, the inter-conductor dielectric layer 203 and the second bonding layer 202 of the second substrate are coupled, a reference pressure cavity 101c is formed at a position corresponding to the opening 101c.

In another embodiment of the present invention, the sequence of the step S1 and the step S2 above may be exchangeable, and the two steps also may be executed simultaneously and the sequence can be either way. In practice, the manufacturing processes of the first substrate and the second substrate may be accomplished in different machines so as to improve the productivity.

So far, the manufacturing of the chip of the MEMS pressure sensor according to the present embodiment has been accomplished. An array of multiple MEMS pressure sensors are provided in the first substrate 100, and a conductor connecting array (not shown) corresponding to the multiple MEMS pressure sensor chips are provided in the second substrate 200. Next, a dicing process is performed, and the manufacturing is switched from the silicon chip manufacturing process to a chip packaging process which is compatible with the chip packaging process of the IC and suitable for the mass manufacturing so as to improve the productivity.

Figure 7:
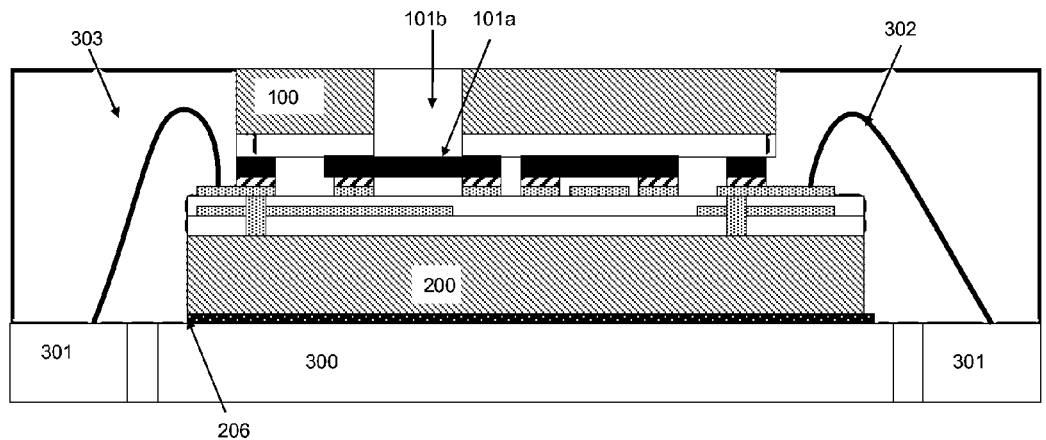

As shown in FIG. 2 and FIG. 7, the packaging process of the MEMS pressure sensor chips includes the following steps.

Step S4: a packaging substrate 300 is provided, and the packaging substrate 300 is provided with multiple wire-bonding pins 301. The packaging substrate 300 may include a lead substrate of ceramic materials or a leadframe, or a printed circuit board (PCB). Step S5: a surface of the second substrate 200 of the MEMS pressure sensor opposite to the first substrate 100 is coupled to the packaging substrate 300, for example, the second substrate 200 is coupled to the packaging substrate 300 by an adhesive 206.

Step S6: the wire-bonding pads 204 on the second substrate 200 are electrically coupled to the corresponding wire-bonding pins 301 on the packaging substrate 300 via a lead 302. Particularly, the two ends of the lead 302 are respectively coupled to the wire-bonding pad 204 and the wire-bonding pin 301 by the wire-bonding process.

Step S7: a plastic molding process is performed on the MEMS pressure sensor after the lead is coupled. A plastic packaging body 303 is filled with the space on the surface of the packaging substrate 300 except for the first substrate 100 and the second substrate 200, so as to protect a functional area such as the pressure sensing unit 101 (and the signal processing circuit), and also function to fix the lead 302.

Furthermore, when the plastic molding process is performed, a mold fixture is applied to prevent the plastic from entering into the opening 101b corresponding to the sensitive diaphragm 101a. The top surface of the finally formed packaging body 303 may be flush with the surface of the first substrate 100 (as shown in FIG. 7), or may protrude with respect to the back surface of the substrate 100. In order to prevent the plastic from entering into the opening 101b, the opening is covered by the mold fixture during the packaging process.

In a preferable embodiment, the packaging process may further include: forming a stress buffer layer (not shown) between the packaging body 303 and the first substrate 100 and the second substrate 200 which are fixedly coupled to each other before performing the plastic mold filling packaging.

The MEMS pressure sensor and the manufacturing method thereof according to an embodiment of the present invention include two substrates, the first substrate is configured to form the piezoresistive pressure sensing unit, and the second substrate is configured to form the conductor connecting layer (and the signal processing circuit thereof). The two substrates are face to face coupled together via the first bonding layer and the second bonding layer, and a sealed structure is formed between the two substrates at the same time. Then, the back surface of the first substrate is etched by silicon deep reactive etching, and a sensitive diaphragm element of the piezoresistive pressure sensing unit and the wire-bonding pad area on the second substrate are exposed at the same time, and finally the packaging is performed. Therefore, the first substrate and the second substrate may be manufactured separately, and either of the manufacturing process of the first substrate and the manufacturing process of the second substrate is compatible with the IC. The two substrates are integrated together by the bonding process, which avoids the complexity of the packaging process integration, decreases the size of the device and reduce the cost, and has the advantage that the process is simple and convenient.

Furthermore, the above method may be achieved by various kinds of plastic packaging such as QFN or DFN, SOIC. As compared to the traditional pressure sensor, the method may effectively reduce the cost and decrease the size of the sensor.

Second Embodiment

Figure 8:
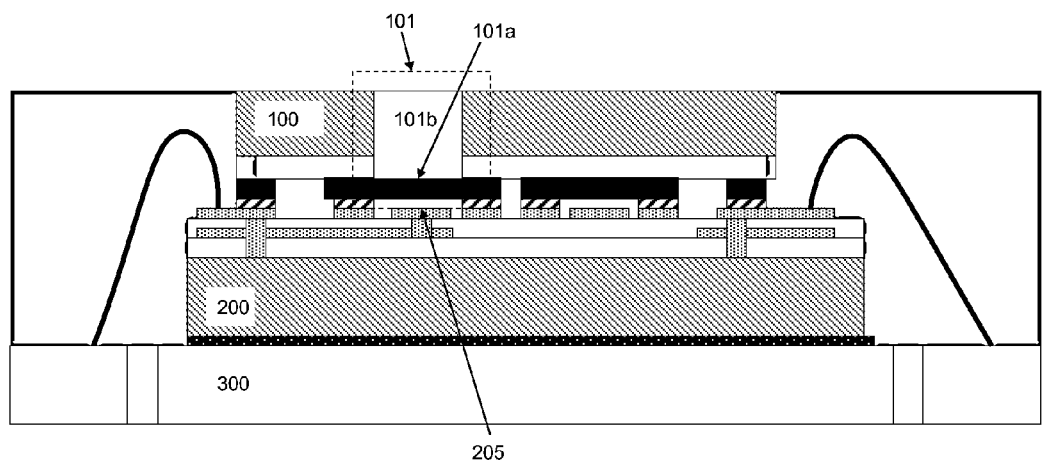
FIG. 8 is a schematic structural diagram of a MEMS pressure sensor according to a second embodiment.

FIG. 8 is a schematic structural diagram of the MEMS pressure sensor according to the present embodiment.

As shown, a self-test electrode 205 is provided on the surface of the second substrate 200 within the reference pressure cavity 101c. The self-test electrode 205 is separated from the sensitive diaphragm 101a at a distance. The self-test electrode 205 corresponds to the sensitive diaphragm in the first substrate 100. And the self-test electrode 205 is coupled to the conductor connecting layer below. A test voltage is applied between the self-test electrode 205 and the sensitive diaphragm 101a so as to achieve the self-test function of the piezoresistive pressure sensing unit. Other structures of the MEMS pressure sensor according to the present embodiment are the same as those of the first Embodiment, and thus omitted here.

The manufacturing method of the MEMS pressure sensor of this embodiment is different from that of the first embodiment only in that: according to the this embodiment, in the manufacturing process of the second substrate 200, the self-test electrode 205 is formed while the second bonding layer 202 is formed in the second substrate 200; or the self-test electrode 205 is formed while the conductor connecting layer 201 is formed in the second substrate 200; and the position of the self-test electrode 205 corresponds to that of the sensitive diaphragm 101a of the piezoresistive pressure sensing unit in the first substrate 100. Preferably, the self-test electrode 205 is provided in the same film layer as the second bonding layer 202, and is formed by the same photolithography and etching process as the second bonding layer 202.

All the above mentioned are only preferable embodiments of the present invention, and will not limit the present invention in any form. A chip of the above MEMS pressure sensor may further include a reference unit which has the same structure as the piezoresistive pressure sensing unit, and the two units constitute a differential sensor. The capacitance of the piezoresistive pressure sensing unit and the capacitance of the reference unit are measured simultaneously, and a difference between the two capacitances is taken as a differential output, which may greatly reduce the influence of the external environmental factors (e.g., temperature, stress) on the output of the sensor.

The second substrate of the MEMS pressure sensor according to the above embodiments includes at least the conductor connecting layer and the second bonding layer, and in practice, may include only the conductor connecting layer which is also used as the second bonding layer.

The "conductor" in the conductor connecting layer, the inter-conductor dielectric layer or the first conductor layer, or the second layer includes but not limited to materials of a metal, an alloy or a semiconductor.

Preferred embodiments of the present invention have been disclosed above, which should not be interpreted as limiting the present invention. Numerous possible alternations, modifications and equivalents can be made to the technical solution of the present invention by those skilled in the art based on the methods and technical contents disclosed herein without deviating from the technical scope of the present invention. Therefore, any simple alternations, modifications, and equivalents made to the above embodiments according to the technical essential of the present invention without deviating form the scope of the present invention should fall within the scope of protection of the present invention.

The invention claimed is:

1. A Micro Electromechanical System (MEMS) pressure sensor comprising:
 a first substrate provided with a sensitive diaphragm of a piezoresistive pressure sensing unit, an electrical connecting diffusion layer and a first bonding layer on a surface of the first substrate;
 a second substrate provided with an inter-conductor dielectric layer, a conductor connecting layer in the inter-conductor dielectric layer and/or a second bonding layer on a surface of the second substrate; and
 a reference pressure cavity which is disposed between the sensitive diaphragm and the second substrate, wherein the reference pressure cavity is a single cavity surrounded by a wall, the wall comprising at least one element selected from a group consisting of the first bonding layer and the second bonding layer;
 wherein the second substrate is arranged opposite to the first substrate, and the second substrate is fixedly coupled to the first substrate via the first bonding layer and the second bonding layer; the pattern of the first bonding layer is corresponding to the pattern of the second bonding layer, and both the first bonding layer and the second bonding layer are formed of a conductive material.

2. The MEMS pressure sensor according to claim 1, wherein the second bonding layer is above the conductor connecting layer, or the second bonding layer is the uppermost conductor layer among the conductor connecting layers.

3. The MEMS pressure sensor according to claim 1, wherein the first substrate comprises a Silicon-On-Insulator (SOI) substrate which sequentially comprises a silicon bulk layer, a buried oxide layer and a SOI layer; and the piezoresistive pressure sensing unit and the electrical connecting diffusion layer are formed in the SOI layer.

4. The MEMS pressure sensor according to claim 3, wherein a Wheatstone bridge consisting of a plurality of resistors is provided in the sensitive diaphragm, and the back surface of the first substrate is provided with an opening through which the sensitive diaphragm is exposed to the atmosphere.

5. The MEMS pressure sensor according to claim 4, wherein the sensitive diaphragm is provided with a protective dielectric layer.

6. The MEMS pressure sensor according to claim 1, wherein the second substrate comprises a SOI substrate or a monocrystalline silicon substrate, and a signal processing circuit is further provided in the substrate below the inter-conductor dielectric layer.

7. The MEMS pressure sensor according to claim 1, wherein a self-test electrode having a position corresponding to that of the sensitive diaphragm is provided in the second bonding layer, in the conductor connecting layer or on the surface of the second substrate within the reference pressure cavity.

8. The MEMS pressure sensor according to claim 1, wherein the second substrate further comprises a plurality of wire-bonding pads on the periphery of the conductor connecting layer, and a part of the first substrate corresponding to the plurality of wire-bonding pads is removed.

9. The MEMS pressure sensor according to claim 8, further comprising:
 a packaging substrate which is disposed below the second substrate and provided with a plurality of wire-bonding pins;
 a packaging body which is disposed above the packaging substrate and encloses the first substrate and the second substrate;
 an adhesive which is disposed between the second substrate and the packaging substrate; and
 a lead which is disposed in the packaging body, two ends of the lead are respectively coupled to the wire-bonding pad and the wire-bonding pin.

10. The MEMS pressure sensor according to claim 9, wherein a stress buffer layer is further provided between the packaging body and the first substrate and the second substrate which are fixedly coupled to each other.

11. A manufacturing method for a MEMS pressure sensor comprising:
provinding a first substrate, and forming, in the first substrate, a piezoresistive pressure sensing unit with a sensitive diaphragm, an electrical connecting diffusion layer and a first bonding layer on a surface of the first substrate;
providing a second substrate, and forming, in the second substrate, an inter-conductor dielectric layer, a conductor connecting layer in the inter-conductor dielectric layer and/or a second bonding layer on a surface of the second substrate; and
arranging the first bonding layer to be opposite to the second bonding layer, and bonding the first bonding layer to the second bonding layer according to a pattern correspondence so as to fixedly and electrically couple the first substrate to the second substrate, and to form, between the sensitive diaphragm and the second substrate, a reference pressure cavity, wherein the reference pressure cavity is a single cavity surrounded by a wall, the wall comprises at least one element selected from a group consisting of the first bonding layer and the second bonding layer;
with a sidewall comprising at least one element selected from a group consisting of the first bonding layer and the second bonding layer.

12. The manufacturing method for the MEMS pressure sensor according to claim 11, wherein the first substrate comprises a SOI substrate which comprises a silicon bulk layer, a buried oxide layer and a SOI layer; and the step of forming, in the first substrate, a piezoresistive pressure sensing unit, an electrical connecting diffusion layer and a first bonding layer on a surface of the first substrate comprises:
manufacturing the piezoresistive pressure sensing unit and the electrical connecting diffusion layer in the SOI layer, and manufacturing a Wheatstone bridge consisting of a plurality of resistors in the sensitive diaphragm;
depositing a first bonding material layer on the surface of the first substrate in which the piezoresistive pressure sensing unit and the electrical connecting diffusion layer are provided; and
etching the first bonding material layer by a photolithography process by using a first mask plate to form the first bonding layer, the part of the first bonding material layer above the sensitive diaphragm being also removed.

13. The manufacturing method for the MEMS pressure sensor according to claim 12, wherein the step of forming, in the second substrate, an inter-conductor dielectric layer, a conductor connecting layer in the inter-conductor dielectric layer and a second bonding layer on a surface of the second substrate comprises:
forming, in the second substrate, an inter-conductor dielectric layer and the conductor connecting layer in the inter-conductor dielectric layer;
depositing a second bonding material layer on the conductor connecting layer, or using the uppermost conductor material layer of the conductor connecting layer as the second bonding material layer; and
etching the second bonding material layer by a photolithography process by using a second mask plate to form the second bonding layer.

14. The manufacturing method for the MEMS pressure sensor according to claim 11, further comprising: forming a plurality of wire-bonding pads in a wire-bonding pad area on the periphery of the conductor connecting layer while forming the second bonding layer on the second substrate.

15. The manufacturing method for the MEMS pressure sensor according to claim 14, further comprising: removing the part of the first substrate corresponding to the wire-bonding pad area to expose the plurality of wire-bonding pads in the wire-bonding pad area before or after fixedly and electrically coupling the first substrate to the second substrate, and meanwhile, removing the silicon bulk layer and the buried oxide layer corresponding to the sensitive diaphragm and opposite to the second substrate, keeping only the sensitive diaphragm.

16. The manufacturing method for the MEMS pressure sensor according to claim 14, further comprising: removing the part of the first substrate corresponding to the wire-bonding pad area to expose the plurality of wire-bonding pads in the wire-bonding pad area before or after fixedly and electrically coupling the first substrate to the second substrate, and meanwhile, removing the silicon bulk layer corresponding to the sensitive diaphragm and opposite to the second substrate, keeping the buried oxide layer and the sensitive diaphragm.

17. The manufacturing method for the MEMS pressure sensor according to claim 12, further comprising:
forming a self-test electrode while forming the second bonding layer in the second substrate, or forming the self-test electrode while forming the conductor connecting layer in the second substrate; the position of the self-test electrode being corresponding to that of the sensitive diaphragm of the piezoresistive pressure sensing unit in the first substrate.

18. The manufacturing method for the MEMS pressure sensor according to claim 14, further comprising after fixedly and electrically coupled the first substrate to the second substrate:
providing a packaging substrate on which a plurality of wire-bonding pins are provided;
coupling the surface of the second substrate opposite to the first substrate to the packaging substrate;
electrically coupling the wire-bonding pads of the second substrate to the corresponding wire-bonding pins on the packaging substrate via a lead; and
performing a plastic molding process to fill a space above the surface of the packaging substrate, except for the first substrate and the second substrate, with a packaging body.

19. The manufacturing method for the MEMS pressure sensor according to claim 18, further comprising before performing the plastic molding process:
forming a buffer stress layer between the packaging body and the first substrate and the second substrate which are fixedly coupled to each other.

* * * * *